(12) United States Patent
Farmer (10) Patent No.: US 9,310,167 B1
(45) Date of Patent: Apr. 12, 2016

(54) COMPACT INFRARED COUNTERMEASURE EMITTER

(75) Inventor: Roger C. Farmer, Arcadia, CA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 1826 days.

(21) Appl. No.: 08/563,635

(22) Filed: Nov. 28, 1995

(51) Int. Cl.
| | |
|---|---|
| *G01S 7/495* | (2006.01) |
| *F41H 11/02* | (2006.01) |
| *F41G 7/22* | (2006.01) |
| *H01S 3/02* | (2006.01) |
| *H01S 3/042* | (2006.01) |
| *H01S 3/00* | (2006.01) |
| *H01S 3/10* | (2006.01) |
| *G01S 7/00* | (2006.01) |
| *F41H 11/00* | (2006.01) |

(52) U.S. Cl.
CPC .............. *F41G 7/224* (2013.01); *F41H 11/02* (2013.01); *G01S 7/495* (2013.01); *H01S 3/0007* (2013.01); *H01S 3/025* (2013.01); *H01S 3/042* (2013.01); *H01S 3/10* (2013.01)

(58) Field of Classification Search
CPC .......... H01S 3/00; H01S 3/0007; H01S 3/02; H01S 3/025; H01S 3/04; H01S 3/042; H01S 3/05; H01S 3/06; H01S 3/0602; H01S 3/0604; H01S 3/0606; H01S 3/09; H01S 3/091; H01S 3/0912; H01S 3/10; H01S 3/11; H01S 3/14; H01S 3/16; H01S 7/38; H01S 7/48; H01S 7/495; F41H 11/00; F41H 11/02; F41G 7/20; F41G 7/22; F41G 7/224

USPC ......... 244/1 R; 398/39; 372/9, 26–28, 34–36, 372/39–50.23, 109, 705; 455/1; 342/13–20; 89/1.11; 250/493.1, 495.1, 503.1, 250/504 R, 504 H
See application file for complete search history.

(56) References Cited

U.S. PATENT DOCUMENTS

| | | | |
|---|---|---|---|
| 3,188,830 A | 6/1965 | Cowans | |
| 3,379,032 A | 4/1968 | Wilson | |
| 3,710,098 A | 1/1973 | Walden | |
| 3,750,189 A | 7/1973 | Flischer | |
| 3,978,342 A | 8/1976 | Hagen et al. | |
| 4,092,614 A | 5/1978 | Sakuma et al. | |
| 4,196,402 A * | 4/1980 | Butler et al. | ................ 372/43 X |
| 4,324,491 A | 4/1982 | Hueber | |
| 4,413,343 A * | 11/1983 | Fukuda et al. | .................. 372/44 |
| 4,433,417 A * | 2/1984 | Burnham et al. | ............... 372/45 |

(Continued)

*Primary Examiner* — Bernarr Greogory
(74) *Attorney, Agent, or Firm* — Perman & Green, LLP (57) ABSTRACT

A semiconductor laser produces infrared radiation suitable for jamming a heat seeking missile, wherein a wavelength of the radiation is in a range of 2-5 microns, and the laser has a semiconductor lasing medium of $Pb_{1-x}Se_xPb_{1-x}Sn_xSe$ or $Ga_{0.84}In_{0.16}As_{0.14}Sb_{0.86}$. These materials can be doped to provide a p/n junction, wherein the laser is excitable by electric current passing through the p/n junction. The third one of these materials can be constructed also as a uniform undoped slab which is excitable optically. Cooling of the lasing medium is accomplished by use of a lithium heat sink thermally coupled to the lasing medium by a diamond thermal diffuser which conducts heat from the relatively small region of the laser to spread out the thermal energy along a relatively large surface of the heat sink. Modulation circuitry is connected to the excitation apparatus to provide a pulse train of the radiation.

31 Claims, 7 Drawing Sheets

(56) References Cited

U.S. PATENT DOCUMENTS

| | | | |
|---|---|---|---|
| 4,812,639 A | 3/1989 | Byren et al. | |
| 4,830,489 A | 5/1989 | Cain et al. | |
| 4,855,602 A * | 8/1989 | Sharma | 250/396 R |
| 5,111,050 A | 5/1992 | Maassen et al. | |
| 5,137,354 A | 8/1992 | Devos et al. | |
| 5,251,225 A * | 10/1993 | Eglash et al. | 372/45 |
| 5,260,575 A | 11/1993 | Iwasaki et al. | |
| 5,315,125 A | 5/1994 | Bannasch | |
| 5,355,382 A * | 10/1994 | Kovacs et al. | 372/36 |
| 5,383,101 A | 1/1995 | Keranen | |
| 5,420,879 A * | 5/1995 | Kawarada et al. | 372/34 X |
| 5,432,535 A | 7/1995 | Andrews et al. | |
| 5,454,002 A | 9/1995 | McCann | |
| 5,600,434 A * | 2/1997 | Warm et al. | 356/139.08 |
| 5,628,196 A | 5/1997 | Farmer | |
| 6,359,710 B1 * | 3/2002 | Takken et al. | 244/3.16 |
| 6,429,446 B1 * | 8/2002 | Labaugh | 244/3.16 |
| 6,785,032 B1 * | 8/2004 | Le Mere | 359/227 |

\* cited by examiner

COMPACT INFRARED COUNTERMEASURE EMITTER

BACKGROUND OF THE INVENTION

This invention relates to emitters of mid-band infrared radiation having a wavelength in the range of 2-5 microns and, more particularly, to an emitter constructed as a semiconductor laser.

Jamming of an infrared heat seeking missile, for the purpose of protecting a friendly aircraft, has been accomplished by transmitting a beam of infrared radiation wherein the radiation amplitude is modulated in the manner of a train of pulses. Such a beam of amplitude modulated, or chopped, radiation is directed at the missile. As is well known, such missiles have a detector assembly which responds to incident radiation to produce a detected signal. The missiles are operative to detect a direction of incident radiation of substantially constant amplitude by a process of chopping the detected signal to gain phase data which directs the missile in the azimuthal and the elevation coordinates for tracking a source of the radiation. The presence of a jamming chopped infrared signal introduces additional pulses to the missile's detected signal resulting in the development of directional errors which drive the missile off course.

A problem exists in that infrared emitters of presently available countermeasures equipment are unduly large and heavy resulting in a diminution of the flight capabilities of aircraft carrying such equipment. By way of example, one such emitter is a cesium arc lamp. Due to the relatively low intensity of the emitted radiation, the emitter has a large reflector to gather and to collimate the radiation to provide a beam of adequate intensity to jam the missile. The transmitter with its electronic modulation equipment add significant weight to the aircraft. Another example of an emitter employs an incandescent heat source which is unduly large and expensive. In the case of the foregoing reflector, such a reflector may have to be mounted partially or completely outside of the aircraft skin. This introduces excessive drag, particularly at high aircraft speed. Furthermore, existing countermeasure emitters may not provide sufficient power to jam a missile at long range from the aircraft carrying such an emitter.

SUMMARY OF THE INVENTION

The foregoing problem is overcome and other advantages are provided by a countermeasures infrared emitter comprising a semiconductor laser. The semiconductor laser has reduced size and weight, as compared to emitters of the prior art, and requires significantly less power resulting in a substantial diminution in the size of the electrical power supply. In addition, the collecting optics employed with the semiconductor laser is significantly smaller than the collecting optics of the prior-art emitters. The semiconductor laser may be fabricated in any one of three embodiments, namely, (1) a lead chalcogenide laser diode having a p/n junction and employing electrical excitation, (2) a III-V compound laser diode having a p/n junction and employing electrical excitation, and (3) a uniform slab of the foregoing III-V compound having no doping and no p/n junction and employing optical excitation. In a preferred embodiment of the invention, cooling of the lasing medium is accomplished by use of a lithium heat sink thermally coupled to the lasing medium by a diamond thermal diffuser which conducts heat from the relatively small region of the laser to spread out the thermal energy along a relatively large surface of the heat sink.

BRIEF DESCRIPTION OF THE DRAWINGS

The aforementioned aspects and other features of the invention are explained in the following description, taken in connection with the accompanying drawing figures wherein.

Identically labeled elements appearing in different ones of the figures refer to the same element in the different figures but may not be referenced in the description for all figures.

DETAILED DESCRIPTION

Figure 1:
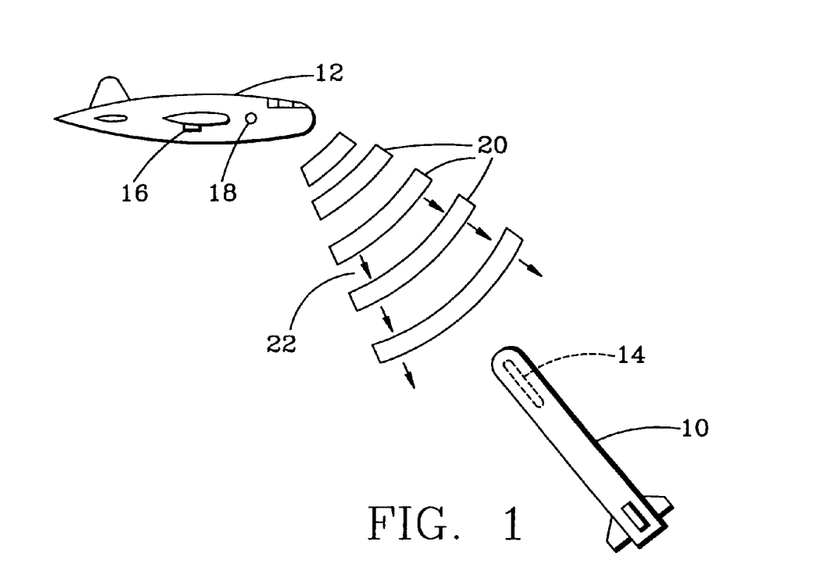
FIG. 1 shows a stylized view of an aircraft jamming an approaching missile by use of a pulsed beam of infrared radiation.

FIG. 1 presents a countermeasures situation wherein a missile 10 attacks an aircraft 12. The missile 10 has a detector assembly 14 which is responsive to infrared radiation in the mid-infrared region having a wavelength in the range of typically 2-5 microns. The aircraft 12 has jet engines 16, one of which is shown, which emit radiation in the foregoing mid-infrared region. As the missile 10 approaches the aircraft 12, the detector assembly 14 detects the infrared radiation emitted by the aircraft engines 16. The detector assembly 14 develops azimuth and elevation error signals which direct the missile toward the aircraft 12. Operation of the detector assembly 14 is based on reception of radiation of substantially constant intensity followed by a chopping of the detected signal to develop phase data for providing the azimuth and the elevation signals.

The aircraft 12 carries an infrared countermeasures unit 18 which emits a sequence of pulses 20 of radiation in a diverging beam 22, the radiation pulses being in the aforementioned mid-infrared region. The pulse duty cycle is in the range of approximately 2-25 percent. The pulses 20 of the radiation are detected by the missile detector assembly 14 and interact with the chopping pulses to introduce errors in the missile azimuth and elevation signals. The erroneous azimuth and elevation signals direct the missile 10 away from the aircraft 12 resulting in a successful countermeasures operation wherein the aircraft 12 has been saved from the attack of the missile 10.

Figure 2:
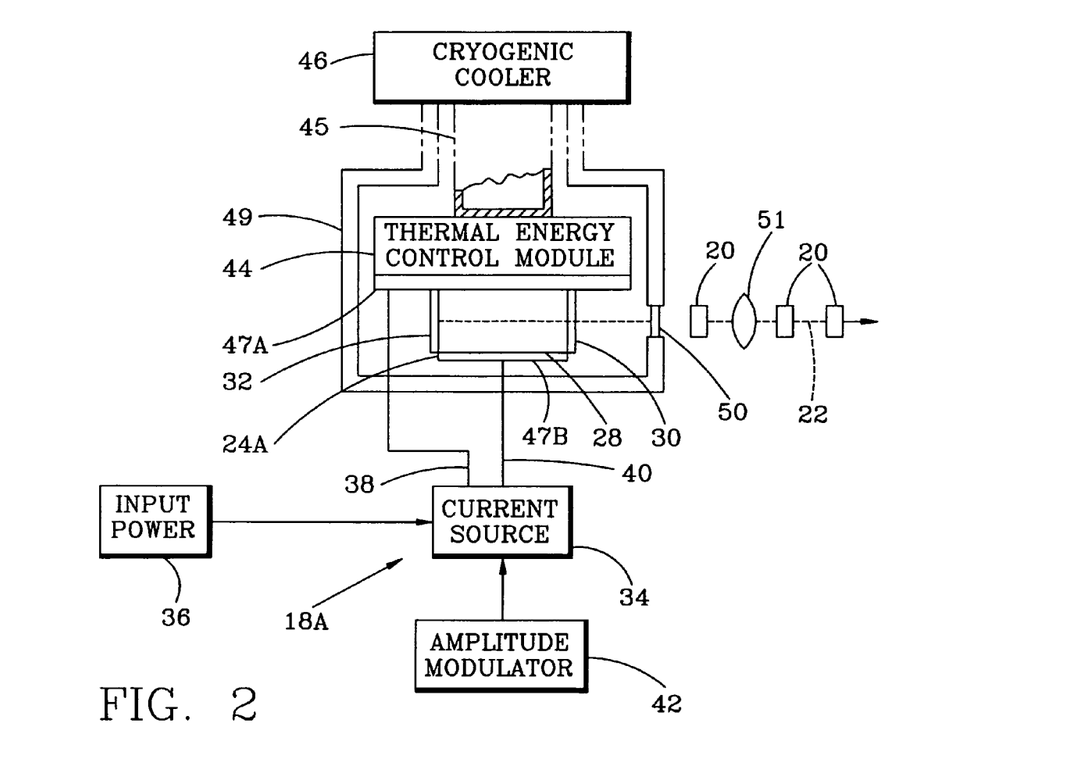
FIG. 2 is a diagram of a semiconductor laser emitter with associated optics and electrical excitation power for a laser of semiconductor material doped to form a p/n junction.

FIG. 2 shows a countermeasures unit 18A constructed in accordance with a first embodiment of the countermeasures unit 18 of FIG. 1. In FIG. 2, the countermeasures unit 18A comprises a laser 24A which emits the pulses 20 of radiation of the beam 22. The lasing medium of the laser 24A comprises a semiconductor material which is doped to have a p/n junction constituting a diode. The lasing medium of the laser 24A is a solid semiconductor slab 28 which has opposed end mirrors 30 and 32 disposed on opposed end facets of the slab 28. The mirror 30 is a front mirror and the mirror 32 is a back mirror. Upon excitation of the laser slab 28 electrically with current from a current source 34, the laser slab 28 emits the infrared radiation. The radiation is reflected back and forth between the end mirrors 30 and 32 to build up to a desired level of radiation intensity. The mirrors 30 and 32 may be formed of layers of a reflecting metal such as gold or silver, wherein the layer of the front mirror 30 is thinner than the layer of the back mirror 32 to allow exit of the beam 22 from the front mirror 30.

The current source 34 receives input electric power from a power supply 36. Current outputted from the current source 34 to the slab 28, via wires 38 and 40, is modulated in amplitude by modulator 42 to provide pulses of the current to the slab 28. The pulsing of the current to the slab 28 results in a pulsing of the radiation emitted by the lasing medium, and a formation of a series of the radiation pulses 20 transmitted to the missile 10 (FIG. 1). Also included within the countermeasures unit 18A is a thermal energy control module 44, a cold finger 45 (shown partially sectioned), and a cryogenic cooler 46. The module 44 is in thermal contact with the laser 24A for withdrawing, in the manner of a heat sink, heat dissipated by the laser 24A. The heat is produced by the flow of the electric current through the slab 28. The cooler 46 withdraws heat from the module 44, via the cold finger 45, by cooling the module 44 and, thereby, discharges the heat of the slab 28 to the environment external to the countermeasures unit 18A.

The module 44 has an electrically conductive surface which abuts one face of the slab 28 to serve as an electrode 47A by which the wire 38 makes electrical contact with the slab 28. An opposite face of the slab 28 is made into an ohmic contact 47B by which the wire 40 makes electrical contact with the slab 28. A vacuum chamber 49 is formed by a vacuum-tight housing which encloses the laser 24A and the module 44 and the cold finger 45. The chamber 49 thermally insulates the laser 24A from the outside environment for maintenance of a cryogenic temperature, and also protects the laser 24A from contamination by the external environment as well as from the formation of moisture and/or ice on the laser 24A. A housing wall of the chamber includes a window 50 which is transparent to the infrared radiation emitted by the laser 24A to allow exit of the beam 22. A lens system 51 collimates the radiation emitted by the laser 24A to form the beam 22 with a narrow beam width of approximately a few milliradians so as to provide adequate jamming signal strength at distances on the order of many miles from the countermeasures unit 18A (FIG. 1). The lens system 51 is representative of a lens assembly which may include a cylindrical or barrel lens element for a more accurate collimation of the radiation which is emitted by the laser 24A with different dispersion angles in different orthogonal planes. Not shown in the figures but included within the countermeasures unit 18A is a well known guidance system for pointing the beam 22 toward the missile 10 (FIG. 1).

The laser 24A of FIG. 2 may be constructed of a lead chalcogenide or a III-V compound of semiconductor material having a p/n junction for formation of a diode. In the case of the lead chalcogenide laser diodes, such laser diodes are characteristically formed from $Pb_{1-x}Se_xPb_{1-x}Sn_xSe$ compounds. These compounds operate at cryogenic temperatures and have relatively low output power. They are commercially available from at least two manufacturers. Radiation wavelength in the mid-infrared region is available. The material of the lasing medium of the laser 24A requires an operating temperature less than approximately 125 degrees Kelvin. The cooling apparatus, including the module 44 and the cold finger 45 and the cooler 46, is operative to reduce the temperature of the lasing medium to approximately 50 degrees Kelvin between the laser radiation pulses 20, while allowing the temperature to rise up to approximately 90 degrees Kelvin during a laser radiation pulse 20 for a nominal values of the radiation pulse duration and duty cycle.

The III-V compounds for semiconductor laser diodes characteristically have active layers formed of $Ga_{0.84}In_{0.16}As_{0.14}Sb_{0.86}$, and are capable of high power output which is greater than that of laser diodes. However, this material has very high series resistance and generates large amounts of heating on passage of electric current through the material. When operated at cryogenic temperatures, this material necessitates use of very large and expensive cooling apparatus in order to make available the full power capability. Nevertheless, such device with its cooling apparatus would be suitable for small to medium sized aircraft for performing the countermeasure function. The laser material of the III-V compounds is also available commercially.

Figure 3:
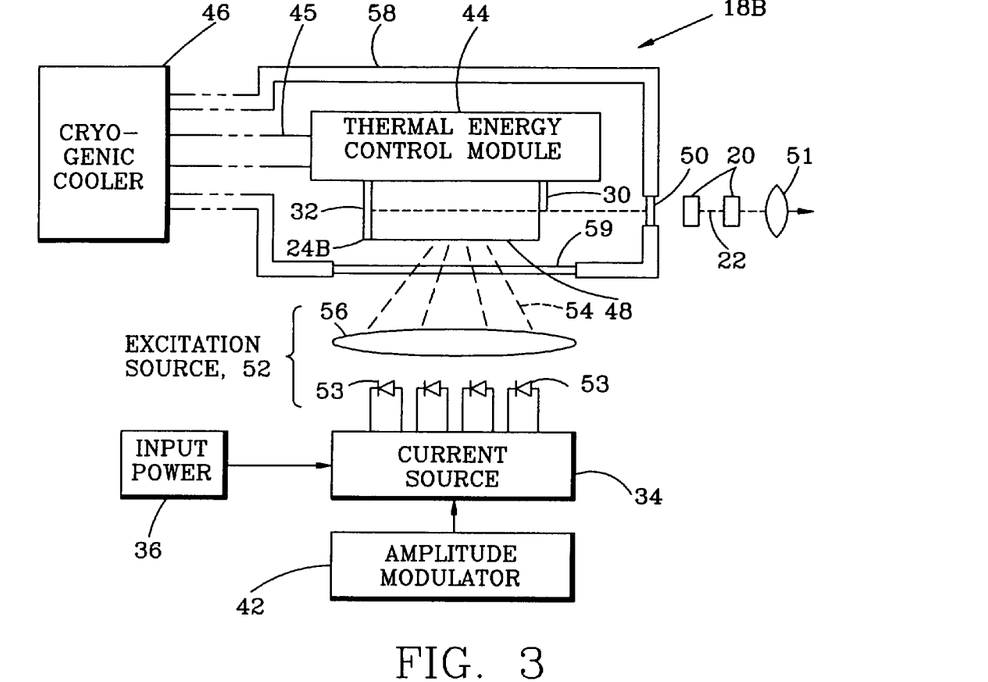
FIG. 3 is a diagram of a semiconductor laser emitter with associated optics and electrical circuitry for optical excitation of a laser of uniform undoped semiconductor material.

FIG. 3 shows a countermeasures unit 18B constructed in accordance with a second embodiment of the countermeasures unit 18 of FIG. 1. In FIG. 3, the countermeasures unit 18B is seen to comprise much of the equipment shown previously in FIG. 2 for the countermeasures unit 18A. Thus, both the units 18A and 18B include the thermal energy control module 44, the cold finger 45 and the cryogenic cooler 46, as well as the current source 34, the power supply 36, and the amplitude modulator 42. The countermeasures unit 18B further comprises a laser 24B which differs in its construction from the laser 24A. The laser 24B includes a slab 48 of uniform undoped semiconductor material, and supports the front mirror 30 and the back mirror 32 described previously in the construction of the laser 24A of FIG. 2. Since the material of the slab 48 is undoped, there is no p/n junction. Accordingly, excitation of the lasing medium is accomplished by an optical excitation source 52 rather than by use of the electrical excitation disclosed in FIG. 2.

As shown in FIG. 3, the excitation source 52 comprises a source of excitation radiation, such as a set of laser diodes 53 which are electrically excited by current from the current source 44 to emit radiation 54 to the slab 48. The radiation 54, which may be referred to as the excitation or pump radiation, is focused by a lens system 56. The lens system 56 is representative of a lens assembly which may include a cylindrical or barrel lens for focussing radiation from a line array of the diodes 53 upon the laser slab 48, and for illuminating the entire length of the slab 48. Typically the footprint of the radiation 54 upon the slab 48 would measure a few millimeters (mm) in length, between the mirrors 30 and 32, and be relatively narrow in the transverse direction to have a width in the range of 0.1 to 0.5 mm. Also included in the countermeasures unit 18B is a vacuum chamber 58 which encloses the laser 24B, the module 44 and the cold finger 45. The chamber 58 is functionally equivalent to the vacuum chamber 49 (FIG. 2) but has two windows rather than the single window of the chamber 49. The first of the two windows of the chamber 58 is the window 50 in front of the laser 24B providing access to the beam 22 emitted by the laser 24B, and the second of the two windows is a window 59 at the side of the laser 24B for admitting the radiation 54 from the set of diodes 53. The lens system 51 serves to collimate the beam 22 from the laser 24B in the same fashion as described above for the collimation of the beam 22 from the laser 24A.

Upon excitation of the semiconductor material of the slab 48 to emit radiation, the laser 24B functions in a manner analogous to that of the laser 24A (FIG. 2) to emit the infrared beam 22. Upon a pulsing of the current of the source 34 by the modulator 42, the source 34 applies the pulsed current to the diodes 53 which, in turn, emit pulses of the excitation radiation to the slab 48, this resulting in the emission of the radiation pulses 20 from the laser 24B. In order to excite the material of the slab 48, the frequency of the excitation radiation 54 is greater than the frequency of the emitted radiation 22, as is well known. The wavelength of the excitation radiation is in the range of 0.94-0.97 microns, this being substantially less than the output radiation wavelength, approximately 4 microns, of the laser 24B.

Figure 4:
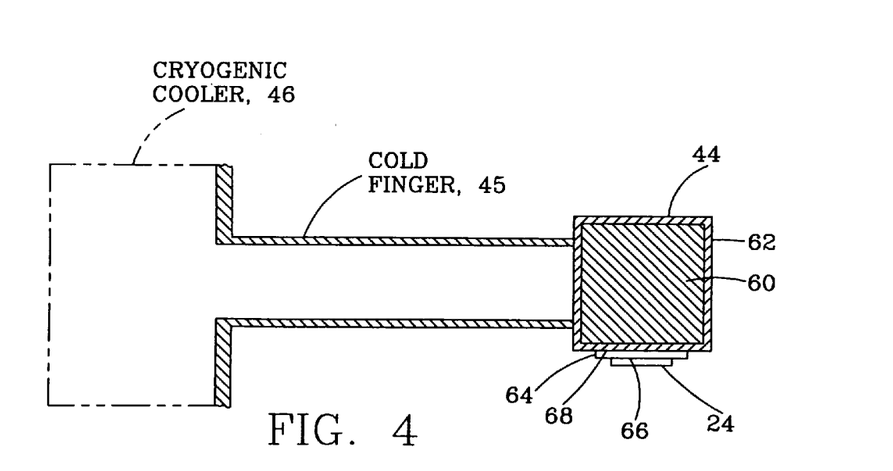
FIG. 4 is a diagram showing support of a semiconductor laser by cryogenic equipment for extraction of heat to maintain laser operating temperature.

The laser 24B of FIG. 3 employs the same III-V compound as does the laser diode 24A except that, in the case of the laser 24B there is no doping of the material for production of a p/n junction. The laser 24B as noted hereinabove, employs the optical excitation instead of the electrical excitation of the laser 24A, the optical excitation reducing the heating losses associated with electrical excitation currents by almost two orders of magnitude. This factor, combined with the thermal energy storage technique, to be described with reference to FIG. 4, provides for a residual heat dissipation useful for low duty cycle jamming technology. In the case of the laser 24A employing the electrical excitation, the current source 34 provides approximately a few amperes, with a wide range of jamming modulations at modulation frequencies ranging from 50 Hz to 40 KHz. In the case of the set of laser diodes 53 (FIG. 3) for the optical excitation, these laser diodes operate at room temperature. The current source 34 provides current, typically on the order of 100 amperes, for operation of the laser diodes 53 for excitation of the jamming laser 24B.

FIG. 4 shows interconnection of the cryogenic cooler 46 to the energy control module 44 by means of a cold finger 58. A laser 24 is supported by the module 44, and is in thermal contact with the module 44. The laser 24 is a semiconductor laser and may be constructed in accordance with the construction of either of the laser embodiments 24A or 24B, as described above with reference to FIGS. 2 and 3. Each of the laser slabs 28 and 48 has dimensions, typically of 2 millimeters (mm) in width, 3 mm in length, and 0.1 mm in thickness. The cold finger 45 and the module 44 are composed of thermally conducting metal, and are shown in cross-sectional view to facilitate an understanding of their construction. The module 44 comprises a heat sink 60 enclosed within a housing 62. The housing 62 of the module 44 connects directly with the cold finger 45, and connects via a diffuser 64 to the laser 24. The diffuser 64 has the configuration of a plate which is larger than a corresponding mating surface of the laser 24 so as to diffuse heat emitted by the laser 24 over a region of the module 44 which is substantially larger than the mating surface of the laser 24.

FIG. 4 has been simplified by elimination of the sources of excitation of the laser 24. In the event that the laser 24 is constructed as the laser 24A of FIG. 2, then it is understood that the electric wires 38 and 40 are to be connected to the laser 24. In the event that the laser 24 is to be constructed as the laser 24B of FIG. 3, then it is to be understood that the excitation source 52 is to be positioned for directing the radiation 54 toward the laser 24. In the operation of the energy control module 44, the heat sink 60 comprises lithium. Lithium has a high energy storage capacity. By way of example, the thermal energy storage capacity of lithium is over seven times that of copper at cryogenic temperatures. Therefore, lithium makes a far superior heat sink than would a block of copper or other metal or thermal conductor. However, lithium is relatively reactive with many chemical compounds, and ignites spontaneously in air at slightly above its melting point of 180° centigrade. Accordingly, the lithium of the heat sink 60 is enclosed within the housing 62 which protects the lithium from the atmosphere. The housing 62 is composed of a thermally conductive metal, such as copper or aluminum or magnesium, which do not react with the lithium. Magnesium has the highest thermal energy storage of the three metals, but not as high as the thermal energy storage of lithium. The walls of the housing 62 are sufficiently thin so as to offer little thermal resistance to the flow of heat, while being sufficiently strong to protect the lithium and to support the lithium at the end of the cold finger 58.

The diffuser 64 is fabricated of solid industrial diamond. Diamond has the unique property of almost infinite thermal diffusivity at cryogenic temperatures. Indeed, the diamond diffusivity at cryogenic temperatures is approximately 1,000 times greater than that of copper, by way of example.

Therefore, the effect of emplacement of the diffuser 64 between the laser 24 and the module 44 is to distribute, virtually instantaneously, the lost or dissipated energy from the lasing process of the laser 24 over a wide area. Diamond has almost zero energy storage at the cryogenic temperatures, this facilitating its function of spreading the energy over a large area of the material of the housing 62 and over the surface of the lithium heat sink 60. Also, the thermal response of diamond is sufficiently fast so as to enable effective cooling of the laser 24 during the interpulse interval following a pulse 20 of the emitted radiation 22. Indeed, there is sufficient extraction of heat during the presence of the radiation pulse 20 so as to allow a greater peak laser output power to be generated without an excessive raising of the temperature of the lasing medium.

The diamond diffuser 64 has the shape of a flat plate which has a thickness of one mm, with a width and a length of 8 mm and 10 mm, respectively. The semiconductor slab of the laser is secured to the diffuser 64 by an indium solder, the solder being disposed in a layer 66 approximately one mil thick. Such thickness of the solder presents a sufficiently short thermal path so as to offer no appreciable impediment to the cooling process. A similar layer 68 of indium solder may be employed for securing the diffuser 64 to the housing 62. The relatively high specific heat of the lithium employed in the heat sink 60, in combination with the high thermal conductivity and low specific heat of the diamond diffuser 64, enable the energy control module 44 to be constructed with a much smaller size and weight than has been possible heretofore.

The use of the lithium heat sink allows a weight reduction, by a factor of seven, over a conventional copper heat sink because of the greater specific heat of the lithium. The cold finger has very thin walls to prevent thermal conduction to the cold finger of ambient heat, and has limited capability to support weight of a large heat sink. The smaller the size of the cooling apparatus, the smaller the weight of a heat sink which can be supported by the cold finger. A reduction in the size of the cooling apparatus, as is provided by the present invention, provides for a large savings in weight and cost. By way of example in the construction of a preferred embodiment of the invention, the laser 24 with its associated electronics weigh approximately 10 pounds, utilize 40 watts of electrical power and produce approximately 16 times the jamming power of previously available arc lamp systems. The collecting optics is less than one inch in diameter. Additional cooling capacity would allow a further increase in jamming power by a factor 4 to 7 times that attained above in the preferred embodiment of the invention.

Figure 5:
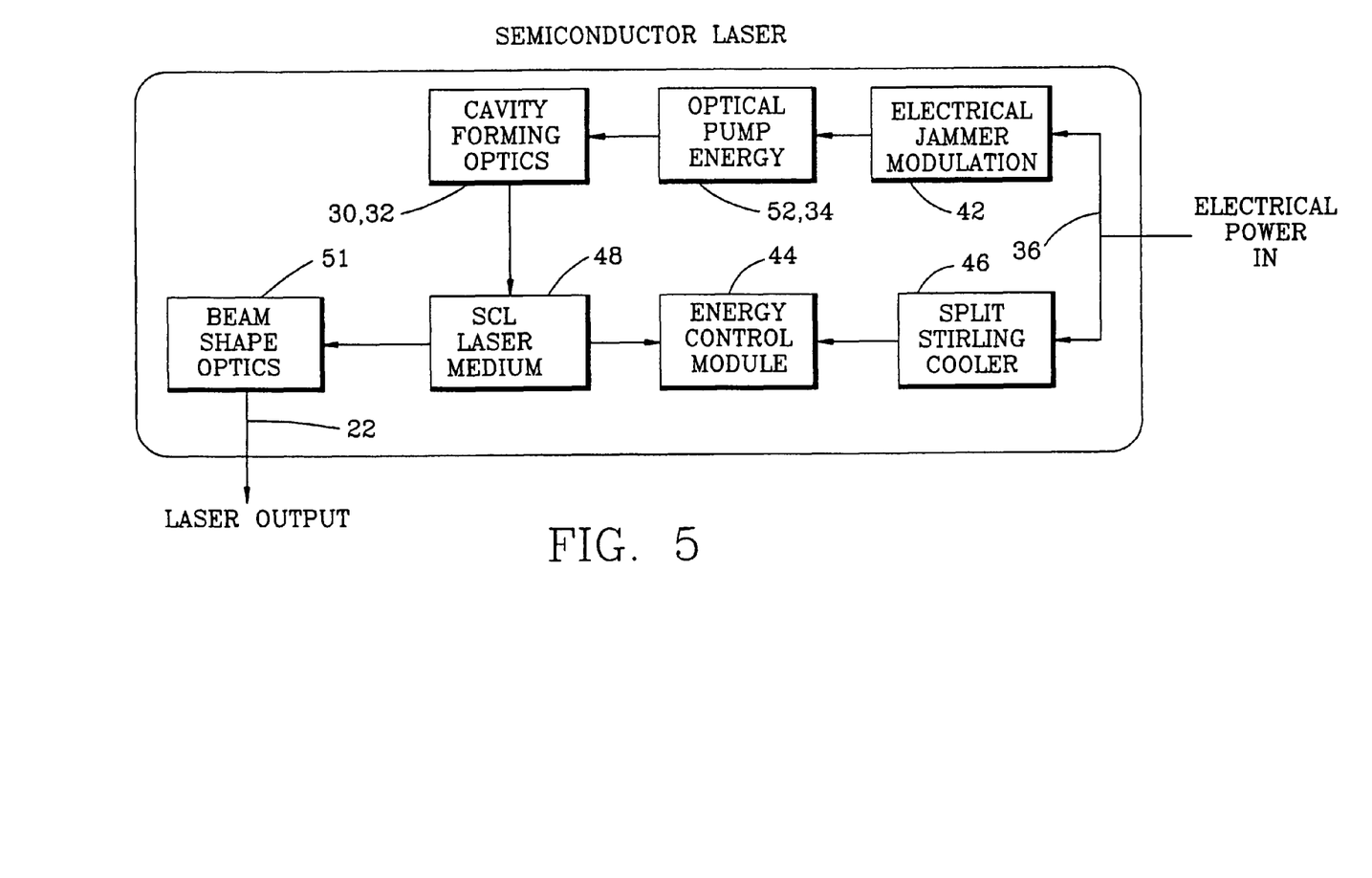
FIG. 5 is a block diagram showing the arrangement of basic components of the semiconductor laser.

FIG. 5 summarizes the arrangement of the basic components of the countermeasures unit 18A or 18B for the excitation of the laser, as shown in FIGS. 2 and 3. Electrical input power is applied at 36 for operation of the electrical jammer modulator 42, and the cryogenic cooler 46 which is preferably a split Stirling cooler. The output of the modulator 42 is applied to the optical pump energy represented by the current source 34 in FIG. 2 and by both the current source 34 and the optical excitation source 52 in FIG. 3. The optical pump energy is directed to a region of the laser between the mirrors 30 and 32 which form the laser cavity optics for exciting the lasing medium of the slab 48. The output radiation of the lasing medium 48 is applied by the beam shape optics, represented by the lens system 51, to produce the laser beam 22. Both the lasing medium 48 and the cooler 46 connect with the heat sink represented by the energy control module 44 for extraction of heat from the lasing medium 48.

Figure 6:
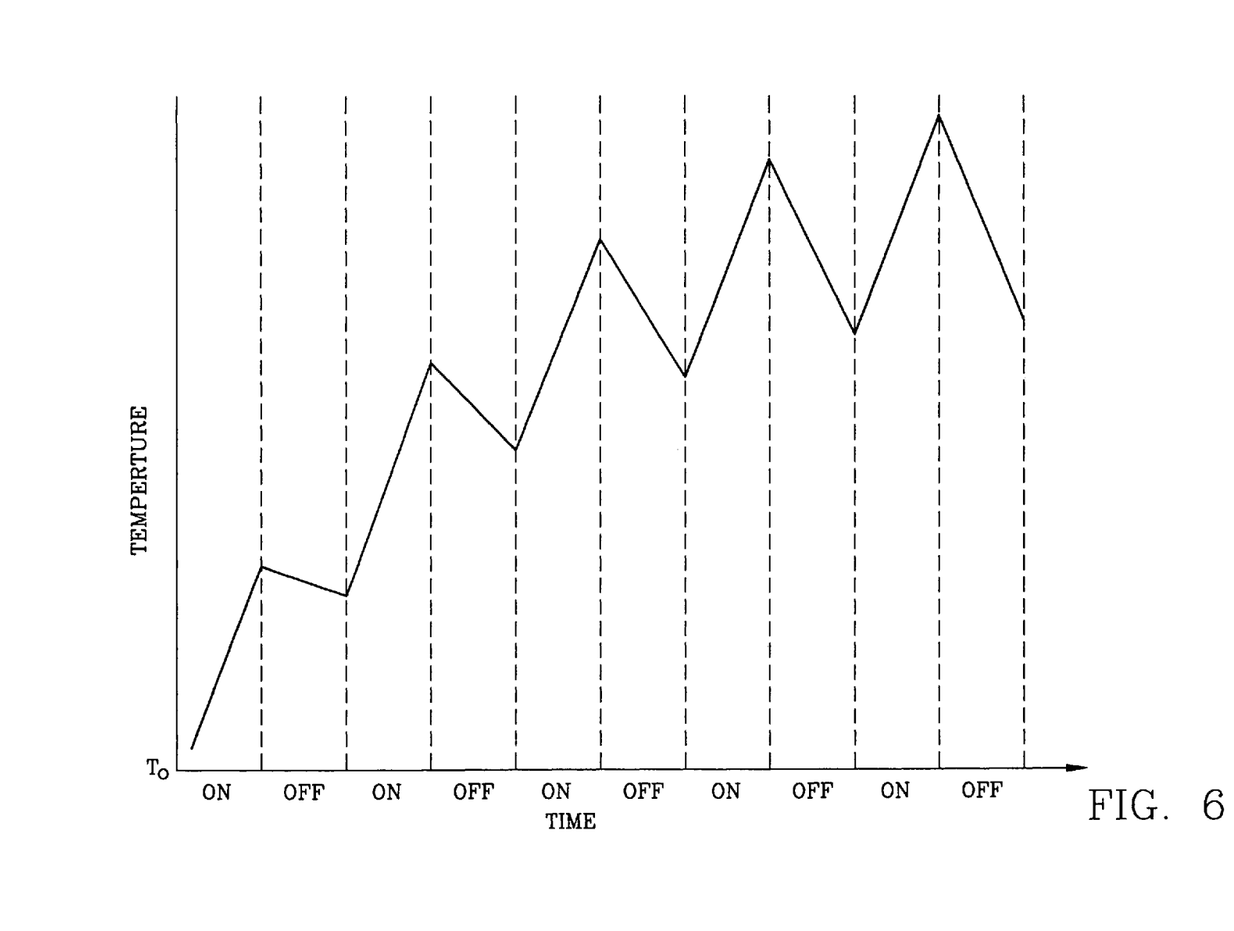
FIG. 6 is a graph showing temperature versus time of a heat sink which cools the semiconductor laser during pulsed radiation from the laser.

With reference to FIG. 6, the graph of temperature of the heat sink as a function of time is shown for the situation wherein the laser excitation is provided in a pulsed format, this resulting in the outputting of both pulses of infrared radiation and pulses of heat. The infrared radiation is processed by the focusing optics of the lens system 51 (FIGS. 2 and 3), while the outputted heat from the lasing medium of the slab 48 is conducted away from the slab 48 by the energy control module 44, the cold finger 45 and the cooler 46. As a result of the alternating states of an outputting of heat by the lasing medium followed by a dormant interval wherein the laser is deenergized, the temperature of the heat sink, as shown on the vertical axis of FIG. 6, is seen to rise and to fall alternately. The rising and the falling temperature continue until a state of equilibrium is reached asymptotically wherein the rising and falling temperature of the heat sink occur in a periodic fashion. In the graph, the intervals of time wherein the laser is excited as represented by the term "on", and the period wherein the laser is deenergized is represented by the term "off". The operation begins at the temperature $T_0$ indicated at the lower left corner of the graph.

While the "on" times show the same temperature rise for a constant "on" period, this is an idealized representation and may not be always the case because the power input may vary due to changes in peak power or duty cycle of the jammer modulation. Also, it is noted that the specific heat of the material of the heat sink increases significantly as the temperature of the heat sink increases with the result that the temperature rise during each "on" cycle would be less for successive cycles.

In the simplified representation of FIG. 6, the "off" periods are shown as equal to "on" periods, but this would not necessarily be the case. Generally, the "off" cycle is significantly longer than the "on" cycle, possibly by a factor of three. By way of example, if the laser were on during an interval of 10 seconds, and the off or deenergized interval were 30 seconds in duration, the cooler 46 would require a cooling capacity which would be normally one-quarter of the size that would be required if the laser were on continuously. Also, it is noted by inspection of the graph of FIG. 6 that the decrease in temperature during the "off" cycle is seen to increase during successive ones of the cycles. This occurs because the efficiency of the cooler increases with an increased temperature of the source of heat, namely, the heat sink, which inputs the heat to the cooler.

In the upper right portion of the graph of FIG. 6, it is noted that the temperature maximum occurs when the input average power equals the cooler capacity. If the maximum temperature for a given situation were greater than desired for proper operation of the semiconductor laser, or other device being cooled, then possibly only two or three of the on and the off cycles may be permissible after which interval of time the laser may need to be deenergized for a cool-down period.

Figure 7:
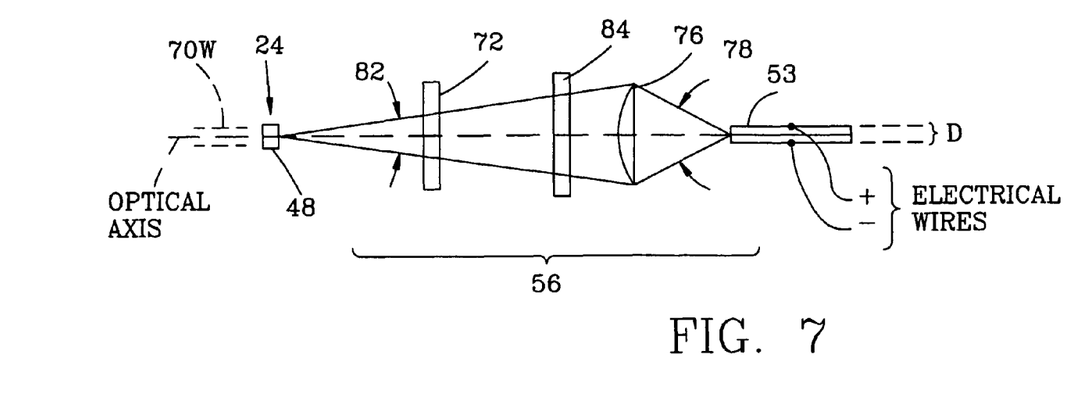
FIG. 7 is a side view, indicated diagrammatically, of an optical system focusing pump radiation for optical excitation of the semiconductor laser.
Figure 8:
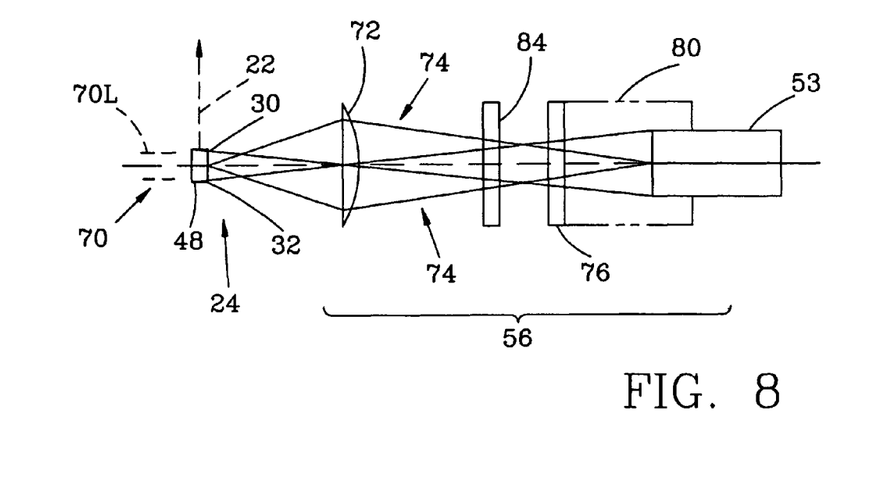
FIG. 8 is a top view of the optical system of FIG. 7.

With reference to FIGS. 7 and 8, the lens system 56 (shown also in FIG. 3) delivers the pump energy from the set of laser diodes 53 for exciting the laser 24. The diodes 53 are arranged in a line array having typically 100 or more diodes occupying a region typically 10 mm long, dimension D, by 0.002 mm wide. The diodes 53 are energized electrically via wires connected to the current source 34 of FIG. 3. The lens system 56 focuses the energy in an elongated region, or footprint 70, upon the lasing medium of the laser 24.

The length 70L of the footprint 70 is the same as the length of the lasing medium, or cavity, between the end mirrors 30 and 32 (FIGS. 2 and 3). The magnitude of the length 70L is attained by means of a cylindrical lens 72. The power of the cylindrical lens 72 need not be large because the divergence angle 74 of the pump laser diodes 53 in this plane is not large, having a value of typically 10 to 15 degrees. The laser pump diodes 53 emit radiation at wavelengths in the range of typically 0.9 to 0.97 microns, such laser diodes being available commercially. A longer wavelength radiation from the pump laser diodes 53 would be preferable because the efficiency of the mid-infrared laser 24 is proportional to the radiation wavelength of the pump laser diodes 53. This may be understood in terms of Planck's equation wherein the longer wavelength photons have less energy but a greater number of the photons.

The width 70W of the footprint 70 is determined by a further cylindrical lens 76 which is placed close to the pump laser diodes 53 because the pump laser diodes 53 have a wide divergence angle 78 in this plane. Focusing of the lens 76 is relatively critical because of the wide divergence angle 78. The focusing of the lens 76 can be facilitated by attachment of the lens 76 to the set of laser diodes 53 by an attachment 80. Thus, the entire lens system 56 is adjustable for focusing because the beam angle 82 is much less than the divergence angle 78. If desired, the focusing may be facilitated by insertion of a low power cylindrical lens 84 between the lenses 72 and 76. Because of the low power of the lens 84, fairly large motions of the lens 84 can be employed to apply fine adjustment of the footprint width 70W. This is important because the footprint width 70W establishes the edges of the cavity of the laser 24. It is noted that, for the same outputted power of the laser diodes 53, the wide cavity in the laser 24 would produce less intensity of the output beam 22 of the laser 24, while a narrow width to the cavity of the laser 24 would provide greater intensity to the beam 22. The width of the cavity of the laser 24 is also important in optimizing the collimation and beam shaping optics for the output laser beam 22. Focusing of the cylindrical lens 72 is not critical because this lens establishes only the size of the footprint 70. If the footprint 70 is somewhat larger than required, the result is only a slight diminution in the efficiency of the laser 24.

Figure 9:
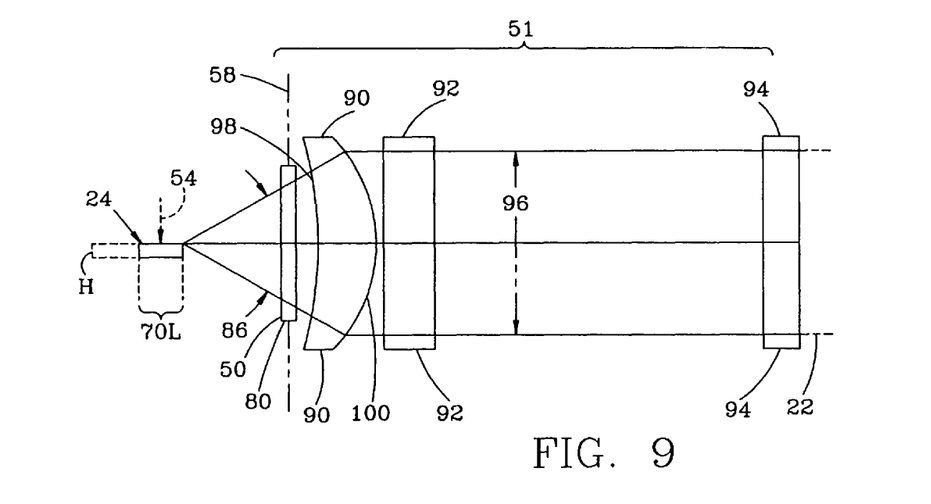
FIG. 9 is a side view of an optical system, indicated diagrammatically, for focusing the radiation of a beam outputted by the semiconductor laser.
Figure 10:
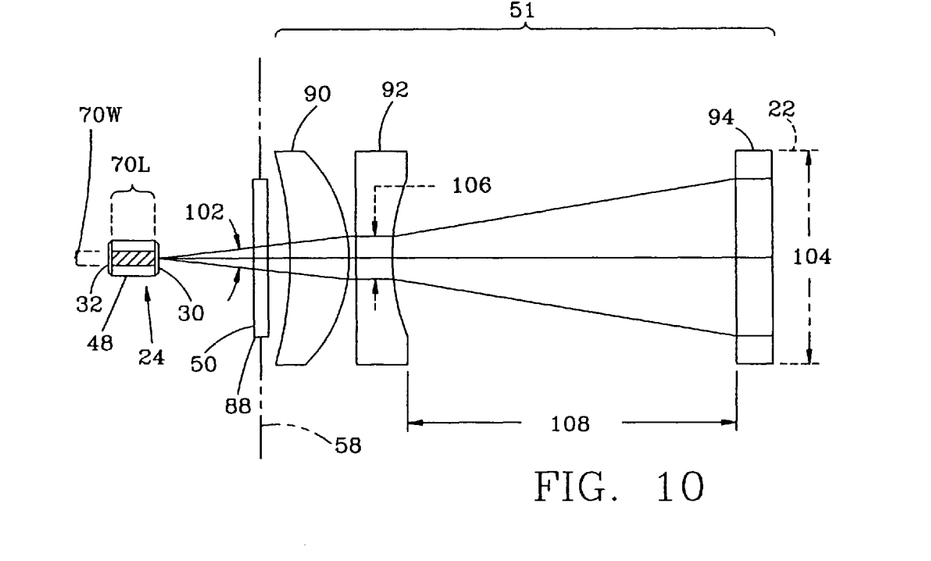
FIG. 10 is a top view of the optical system of FIG. 9.

With reference to FIGS. 9 and 10, the pump energy of the radiation 54 impinges upon the lasing medium of the slab 48 of the laser 24 to form the image represented by the footprint 70 upon the slab 48. The width dimension 70W is to be closely perpendicular to the laser front and rear mirrors 30 and 32. The footprint's width 70W has a value of typically 0.1 to 0.4 mm. The edge view of the laser cavity, dimension H, has a magnitude of approximately 0.002 mm, this dimension being so small that the energy exiting the cavity of the laser 24 is essentially diffraction limited, and emitted in a wide Gaussian beam 86. The plane parallel optical element 50 is the window (previously described in FIGS. 2 and 3) in the Dewar housing of the vacuum chamber 58, and has edges 88 which form an hermetic seal to the Dewar housing in order to maintain a high vacuum within the Dewar housing.

The lens system 51 (previously shown in FIGS. 2 and 3) comprises optical elements 90, 92, and 94 which are used to adjust the divergence of the beam 22 (FIGS. 1-3) in two orthogonal planes as shown in a vertical plane in FIG. 9 and a horizontal plane in FIG. 10. The terms "vertical" and "horizontal" are used for convenience, and not to define an orientation of the beam 22 which may have any desired orientation. FIG. 9 shows a beam expander wherein a beam divergence angle 86 in the vertical plane is reduced by a ratio of the size of the optics exit beam 96 divided by the size of the exit beam at the slab 48. The exit beam at the slab 48 has a dimension in the vertical plane of 0.002 mm, assuming that the optical element 90 is diffraction limited.

Figure 11:
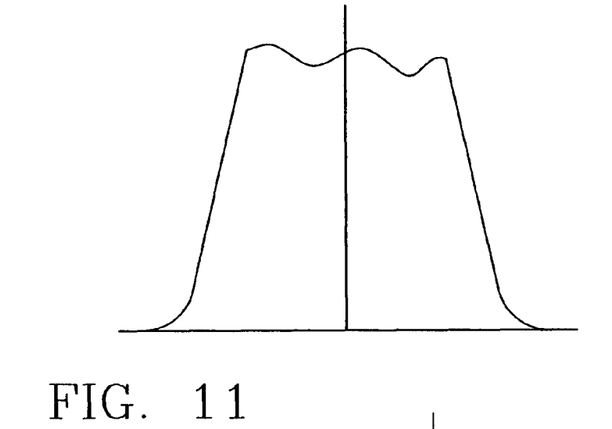
FIG. 11 shows a flat or top hat configuration of a beam outputted by the laser.
Figure 12:
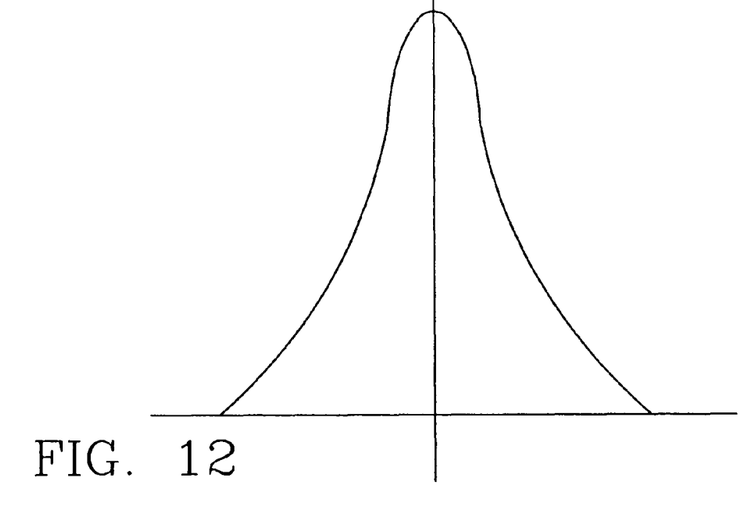
FIG. 12 shows a Gaussian shape to the beam outputted by the laser.

The foregoing relation holds for the situation of the optical element 90 having a first surface 98 which is spherical and a second surface 100 which is aspherical. The second surface 100 is fabricated generally by diamond turning techniques. The optical elements 92 and 94 are cylindrical lenses with essentially no power, or curvature in the vertical plane of FIG. 9. If a wider beam is desired, the optical element 90 is moved slightly out of focus with a precision mechanism (not shown) this affording a variable beam divergence angle. The beam 22 outputted by the lens system 51 may be described as a "top hat" shape as shown in FIG. 11. This configuration of the cross sectional intensity of the beam 22 is more efficient, and more desirable, than a Gaussian cross-sectional shape as shown in FIG. 12. If desired, in a situation wherein a fixed beam is desired, a small amount of distortion can be built into the optical element 90 to provide a more uniform output beam.

The view in FIG. 10 is orthogonal to that of FIG. 9, and shows that the laser cavity has a much larger dimension 70W as compared to the cross-sectional dimension of the exit beam 102. Herein, the function of beam expander may be defined by the ratio of the width 104 of the beam exiting the optical element 94 divided by the width 106 of the beam exiting the optical element 92. Both of the optical elements 90 and 92 have cylindrical lens surfaces with curvature and optical power as demonstrated in FIG. 10. Thus, the beam divergence in the horizontal plane of FIG. 10 can be adjusted independently of the beam divergence in he vertical plane of FIG. 9 by adjusting the spacing 108 between the two cylindrical lenses 92 and 94.

Figure 13:
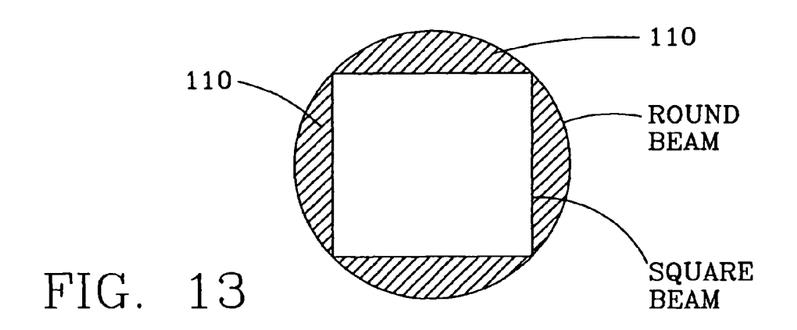
FIG. 13 demonstrates a circular cross section of an output laser beam superposed upon a square cross section of an output laser beam.

In practice, a beam divergence in the range of 2 mr (milliradians) to 10 mr has been attained. In the vertical plane of FIG. 9, a beam divergence of 0.5 mr to 10 mr has been attained. The nominal beam size is 2 mr by 2 mr in a square configuration; however, a round beam can be produced with appropriate aperture stops. The foregoing square beam is more efficient in placing energy on a target, such as the missile of FIG. 1. The square and the circular configurations of the output beam are shown in FIG. 13. It is noted that there are shaded areas 110 disposed exteriorly to the square beam and bounded by the circular beam, as shown in FIG. 13. The shaded areas 110 represent wasted energy of the round beam in the situation wherein a conventional X-Y pointing system is employed for orienting the beam 22 in FIG. 1. All of the optical elements of the lens system 51 of FIGS. 9 and 10 are transparent to the mid-infrared radiation, and are coated with an anti-reflective coating to produce a high optical throughput.

It is to be understood that the above described embodiments of the invention are illustrative only, and that modifications thereof may occur to those skilled in the art. Accordingly, this invention is not to be regarded as limited to the embodiments disclosed herein, but is to be limited only as defined by the appended claims.

What is claimed is:

1. A countermeasures system for thwarting an attack by a heat seeking missile, comprising:
a laser having a lasing medium;
excitation means for exciting the lasing medium to emit infrared radiation to be radiated at the missile;
cryogenic means for cooling said lasing medium to a cryogenic temperature; and
wherein said excitation means includes means for modulating the radiation to produce pulses of the radiation;
said cryogenic means includes a heat sink, and a thermal diffuser thermally interconnecting said heat sink with said lasing medium; and
said lasing medium comprises a semiconductor material.

2. A system according to claim 1 wherein a wavelength of said infrared radiation is in a range of 2-5 microns, and said semiconductor material is $Pb_{1-x}Se_xPb_{1-x}Sn_xSe$ or $Ga_{0.84}In_{0.16}As_{0.14}Sb_{0.86}$.

3. A system according to claim 1 wherein said lasing medium is a lead Chalcogenide or a III-V compound.

4. A system according to claim 1 wherein said heat sink comprises a thermally conductive material of relatively high specific heat, and said diffuser comprises a thermally conductive material of relatively low specific heat and high thermal diffusivity.

5. A system according to claim 4 wherein said thermally conductive material of said heat sink is lithium, and said thermally conductive material of said diffuser is diamond.

6. A system according to claim 5 wherein said cryogenic means further comprises a thermally conductive housing enclosing said lithium.

7. A system according to claim 1 wherein said semiconductor material is doped to provide therein a p/n junction, and said excitation means comprises means for applying an excitation current through said p/n junction.

8. A system according to claim 1 wherein said semiconductor material is a uniform undoped solid slab, and said excitation means comprises means for applying optically an excitation radiation to said lasing medium.

9. A system according to claim 1 wherein said excitation means is an optical excitation means comprising an array of sources of pump radiation and an input lens system comprising cylindrical lens elements, the cylindrical lens elements being oriented in orthogonal planes for altering a configuration of the array of excitation sources to match a configuration of said lasing medium.

10. A system according to claim 1 further comprising an output lens system comprising a plurality of cylindrical lens elements oriented in orthogonal planes for converting a cross-section of a beam of radiation emitted by the lasing medium to a uniform cross-section of transmitted beam.

11. A system according to claim 10 wherein said uniform cross-section of said output beam is square or circular.

12. A laser system comprising:
a laser having a lasing medium comprising a solid slab of semiconductor material;
excitation means for exciting the lasing medium to emit infrared radiation to be radiated at a missile;
cryogenic means for cooling said lasing medium to a cryogenic temperature; and
wherein said cryogenic means includes a heat sink, means for extracting heat from said heat sink, and a thermal diffuser thermally interconnecting said heat sink with said lasing medium;
said slab has a mating surface adapted for thermally mating with said diffuser for withdrawal of heat from the laser, and said sink has a mating surface mating with said diffuser; and
said mating surface of said sink is greater than said mating surface of said slab, said diffuser serving to diffuse heat from the relatively small mating surface of said slab about the relatively large mating surface of said sink.

13. A system according to claim 12 wherein the area of said sink mating surface is greater by at least a factor of approximately 10 than the area of the mating surface of said slab.

14. A system according to claim 13 wherein the specific heat of said sink is greater than that of said diffuser at cryogenic temperatures, and the thermal diffusivity of said diffuser is greater than that of said sink at cryogenic temperatures.

15. A countermeasures system for thwarting an attack by a heat seeking missile, comprising:
a laser having a lasing medium;
an exciter to excite the lasing medium to emit infrared radiation to be radiated at the missile;
a cooling apparatus to cool said lasing medium; and
wherein said exciter includes a modulator to modulate the radiation to produce pulses of the radiation;
said cooling apparatus includes a heat sink and a thermal diffuser to thermally interconnect said heat sink with said lasing medium; and
said lasing medium comprises a semiconductor material.

16. The system according to claim 15 wherein a wavelength of said infrared radiation is in a range of 2-5 microns, and said semiconductor material is $Pb_{1-x}Se_xPb_{1-x}Sn_xSe$ or $Ga_{0.84}In_{0.16}As_{0.14}Sb_{0.86}$.

17. The system according to claim 15 wherein said lasing medium is a lead Chalcogenide or a III-V compound.

18. The system according to claim 15 wherein said heat sink comprises a thermally conductive material of relatively high specific heat, and said diffuser comprises a thermally conductive material of relatively low specific heat and high thermal diffusivity.

19. The system according to claim 18 wherein said thermally conductive material of said heat sink is lithium, and said thermally conductive material of said diffuser is diamond.

20. The system according to claim 19 wherein said cryogenic apparatus further comprises a thermally conductive housing enclosing said lithium.

21. The system according to claim 15 wherein the cooling apparatus comprises cryogenic apparatus to cool said lasing medium to a cryogenic temperature.

22. The system according to claim 15 wherein said semiconductor material is doped to provide therein a p/n junction, and said exciter comprises circuitry to apply an excitation current through said p/n junction.

23. The system according to claim 15 wherein said semiconductor material is a uniform undoped solid slab, and said exciter comprises circuitry to apply optically an excitation radiation to said lasing medium.

24. The system according to claim 15 wherein said semiconductor material is $Ga_{0.84}In_{0.16}As_{0.14}Sb_{0.86}$, said semiconductor material being a uniform undoped material, and being excitable by application of an excitation radiation to said lasing medium.

25. The system according to claim 15 wherein said exciter is an optical exciter comprising an array of sources of pump radiation and an input lens system comprising cylindrical lens elements, the cylindrical lens elements being oriented in orthogonal planes for altering a configuration of the array of excitation sources to match a configuration of said lasing medium.

26. The system according to claim 15 further comprising an output lens system comprising a plurality of cylindrical lens elements oriented in orthogonal planes for converting a cross-section of a beam of radiation emitted by the lasing medium to a uniform cross-section of transmitted beam.

27. The system according to claim 26 wherein said uniform cross-section of said output beam is square or circular.

28. A laser system comprising:
a laser having a lasing medium comprising a solid slab of semiconductor material;
an exciter to excite the lasing medium to emit infrared radiation to be radiated at the missile;
a cooling apparatus to cool said lasing medium; and
wherein said cooling apparatus includes a heat sink, a heat extractor to extract heat from said heat sink, and a thermal diffuser to thermally interconnect said heat sink with said lasing medium;
said lasing medium comprises a semiconductor material;
said slab has a mating surface adapted for thermally mating with said diffuser for withdrawal of heat from the laser, and said sink has a mating surface mating with said diffuser; and
said mating surface of said sink is greater than said mating surface of said slab, said diffuser serving to diffuse heat from the relatively small mating surface of said slab about the relatively large mating surface of said sink.

29. The system according to claim 28 wherein the area of said sink mating surface is greater by at least a factor of approximately 10 than the area of the mating surface of said slab.

30. The system according to claim 29 wherein the specific heat of said sink is greater than that of said diffuser, and the thermal diffusivity of said diffuser is greater than that of said sink.

31. A countermeasures system for thwarting an attack by a heat seeking missile, comprising:
a laser having a lasing medium;
an exciter to excite the lasing medium to emit infrared radiation to be radiated at the missile;
a cooling apparatus to cool said lasing medium; and
wherein said exciter includes a modulator to modulate the radiation to produce pulses of the radiation;
said cooling apparatus includes a heat sink and a thermal diffuser to thermally interconnect said heat sink with said lasing medium.

* * * * *